United States Patent
Schelmbauer et al.

(10) Patent No.: US 9,072,044 B2
(45) Date of Patent: Jun. 30, 2015

(54) PUSH-PULL AMPLIFIER WITH QUIESCENT CURRENT ADJUSTER

(71) Applicant: Intel Mobile Communications GmbH, Neubiberg (DE)

(72) Inventors: Werner Schelmbauer, Steyr (AT); Josef Holzleitner, Wels (AT)

(73) Assignee: Intel Mobile Communications GmbH, Neubiberg (DE)

( * ) Notice: Subject to any disclaimer, the term of this patent is extended or adjusted under 35 U.S.C. 154(b) by 259 days.

(21) Appl. No.: 13/690,516

(22) Filed: Nov. 30, 2012

(65) Prior Publication Data

US 2014/0155126 A1 Jun. 5, 2014

(51) Int. Cl.
*H04M 1/00* (2006.01)
*H04B 1/38* (2006.01)
*H04W 52/02* (2009.01)
*H03F 3/26* (2006.01)
*H03F 1/30* (2006.01)
*H03F 3/30* (2006.01)
*H03F 3/45* (2006.01)

(52) U.S. Cl.
CPC ............ *H04W 52/0209* (2013.01); *H03F 3/265* (2013.01); *H03F 1/308* (2013.01); *H03F 3/3022* (2013.01); *H03F 3/45179* (2013.01); *H03F 3/45632* (2013.01); *H03F 3/45645* (2013.01); *H03F 2203/45008* (2013.01); *H03F 2203/45418* (2013.01); *H03F 2203/45424* (2013.01); *H03F 2203/45434* (2013.01); *H04W 52/0296* (2013.01)

(58) Field of Classification Search
USPC ............ 455/137, 194.1, 194.2, 195.1, 197.3, 455/574; 330/255, 262, 263, 269, 273
See application file for complete search history.

(56) References Cited

U.S. PATENT DOCUMENTS

| | | | | |
|---|---|---|---|---|
| 5,315,231 | A * | 5/1994 | Linder et al. | 323/315 |
| 7,031,127 | B1 * | 4/2006 | D'Aquino et al. | 361/58 |

* cited by examiner

*Primary Examiner* — Tuan H Nguyen
(74) *Attorney, Agent, or Firm* — Eschweiler & Associates, LLC

(57) ABSTRACT

A push-pull amplifier has an input node and a series connection of two resistors. The series connection comprises a first terminal, a second terminal, and a third terminal. A first resistor of the two resistors is connected between the first terminal and the second terminal. A second resistor is connected between the second and third terminals. The input node is connected to the second terminal. A first controllable current source is connected to the first terminal of the series connection for sourcing a first current to the series connection. A second controllable current source is connected to the third terminal of the series connection for sinking a second current from the series connection. A first transistor and a second transistor are connected in push-pull configuration, wherein a control input of the first transistor is connected to the first terminal of the series connection and a control input of the second transistor is connected to the third terminal of the series connection.

28 Claims, 13 Drawing Sheets

PUSH-PULL AMPLIFIER WITH QUIESCENT CURRENT ADJUSTER

FIELD

The present invention relates to a push-pull amplifier. Furthermore, the present invention relates to an amplification arrangement. Furthermore, the present invention relates to a mobile communication device comprising such a push-pull amplifier or amplification arrangement. Furthermore, the present invention relates to a method for amplifying a signal. Furthermore, the present invention relates to a push-pull class AB operational amplifier output stage with new fully independent quiescent current control and common mode output voltage control.

BACKGROUND

There is an ongoing demand for increased battery talk and standby time in wireless communication devices—i.e., between battery recharging periods. Efforts are being undertaken to design the power consumption of circuits in the communication devices to perform its function while consuming the minimum amount of battery power. Reducing the power consumption also has the advantage that the amount of heat generated by the communication device is lower, which typically can be used to reduce efforts for cooling the communication device and/or to facilitate further integration and miniaturization of the communication device.

BRIEF DESCRIPTION OF THE DRAWINGS

The present invention will be described in the following using the accompanying figures in which.

DETAILED DESCRIPTION

Figure 1:
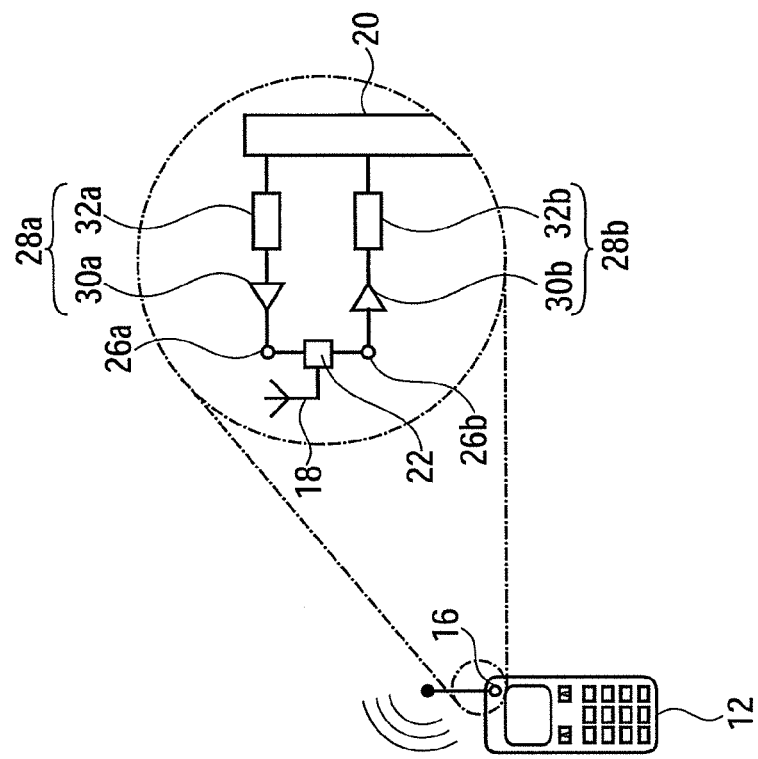
FIG. 1 shows a schematic block diagram of a communication system and a mobile communication device having a transceiver with an improved push-pull amplifier.
Figure 1:
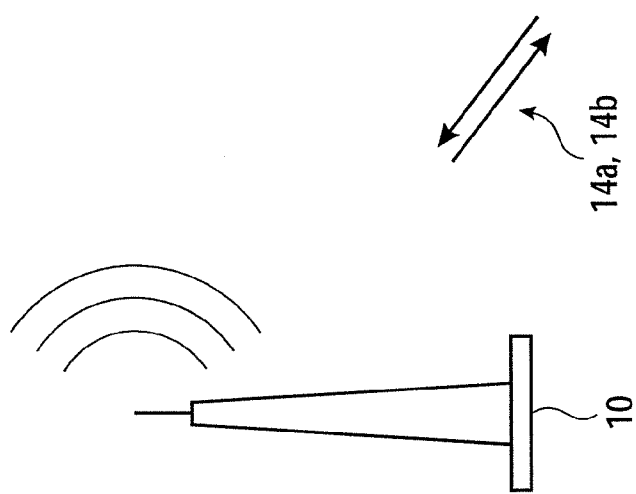

Different embodiments, implementations, circuits, apparatus, examples and the like of the teachings disclosed herein will subsequently be discussed referring to the Figures. Below, identical or similar reference numerals are provided to objects having identical or similar functions so that objects referred to by identical reference numerals within the different embodiments, implementations, circuits, apparatus, examples and the like are interchangeable and a description thereof is mutually applicable.

Wireless communication devices typically rely on radio frequency (RF) power transistors as amplifiers. With the considerable recent growth in the demand for wireless services (e.g., personal communication services (PCS)), the operating frequency of wireless networks has increased and is now well into the gigahertz (GHz) range.

Current and upcoming standards for wireless communication (e.g. LTE) require the power amplifier to have a relatively large dynamic range. This requirement formulated by a number of mobile communications standards may be difficult to reconcile with the desired power efficiency, because a design has to be implemented that has a high efficiency over the wide output power range. Power amplifiers used in linear modulation transmitter schemes for these systems must further exhibit linear performance to meet adjacent channel power (ACP) requirements. In particular, high power amplifier linearity results in better ACP performance, i.e., low spectral re-growth. Conversely, as the power amplifier linearity decreases, the spectral re-growth increases, resulting in poorer ACP performance.

Higher DC input power is typically required at the upper output power range of a power amplifier in order to achieve a sufficient linearity at a specific output power. However, higher linearity is typically at the expense of lower efficiency. It may be a difficult challenge to meet ACP and other performance requirements, while minimizing the DC input power to the power amplifier.

The operating parameters of a power amplifier are typically set in part by the quiescent point and load impedance of each individual amplification stage. The quiescent point is typically defined by the operating voltage and quiescent current for the particular stage. The quiescent current, sometimes also referred to as "idle current" is the DC input current drawn by the power amplifier in the absence of an RF input signal. In other words, with no RF input signal, the DC input current to the power amplifier equals the sum of the quiescent currents of the individual stages. For higher output power, the quiescent current includes a small portion of the DC input current, and for lower output power, a much greater proportion.

In order to achieve overall higher transmitter efficiency, it may be desirable to minimize or reduce the power amplifier quiescent current. Minimizing quiescent current has the most impact on DC input current, and thus battery talk and standby time, when the power amplifier is operated at relatively low output power. As the amplifier output power is decreased, the DC input current typically approaches the quiescent current in an asymptotic manner.

In digital wireless systems the average power amplifier output power during a call is typically substantially less than the maximum rated output power of the accreditation device. Hence, minimizing or reducing the amplifier quiescent current during periods in which only a fraction of the maximum rated output power of the communication device is needed, is likely to have a large impact on battery talk and standby time.

In a high volume production of power amplifiers, the respective amplifier quiescent current will exhibit a broad distribution of values with respect to a fixed biasing control reference voltage. This broad distribution is caused by a statistical spread of, e.g., structure sizes and material properties of each amplifier. This broad distribution is typically referred to as process variations. In addition, the operation of a particular power amplifier may also be influenced by temperature and supply voltage variation.

FIG. 1 shows, in schematic manner, a base station 10 and a mobile communication device 12 which are connected via a downlink port 14a and an uplink port 14b of an air interface. The mobile communication device 12 includes a transceiver 16, an enlarged view of which is schematically shown.

The transceiver 16 is connected to an antenna 18 and has an analog frontend and a baseband processor 20. The analog frontend includes a signal divider element 22 (e.g. a circulator or duplexer), a transmitter 28a, and a receiver 28b. The transmitter 28a and the receiver 28b are arranged between the signal divider element 22 and the baseband processor 20. The transmitter 28a is connected to the divider element 22 via a differential interface 26a. The transmitter 28a includes a differential amplifier 30a and a mixer arrangement 32a which is arranged between the amplifier 30a and the baseband processor 20. The amplifier 30a of the transmitter 28a amplifies a signal provided by the mixer arrangement 32a and feeds it via the differential interface 26a to the divider element 22. The receiver 28b is connected to the divider element 22 via another differential interface 26b. The receiver 28b includes a differential amplifier 30b and a mixer arrangement 32b which is arranged between the amplifier 30b and the baseband processor 20. The amplifier 30b of the receiver 28b may be a low noise amplifier (LNA) and is configured to amplify a signal received by the antenna 18 and forwarded to an input of the amplifier 30b via the signal divider element 22 and the differential interface 26b. The amplified signal out-put by the amplifier 30b is fed to the mixer arrangement 32b for frequency downmixing and subsequent processing by the baseband processor 20.

One or more push-pull amplifiers may be employed in the transmitter amplifier 30a or in the receiver amplifier 30b or in both. Advanced mobile communication standards and upcoming mobile communication standards put relatively high demands on the linearity of the amplified signal. On the other hand, the amplifier is typically desired to have good efficiency. So called class AB amplifiers are typically regarded as providing a good compromise between linearity and power efficiency.

Current push-pull amplifier designs exhibit a dependency between quiescent current control and common mode output voltage control. Some designs also suffer from a relatively small control range and a relatively poor accuracy of the current and voltage. Different solutions often limit the output swing and are not able to deliver rail-to-rail output swing.

One or more of the push-pull amplifiers disclosed below can be utilized for the transmitter amplifier 30a, the receiver amplifier 30b or in both.

Figure 2:
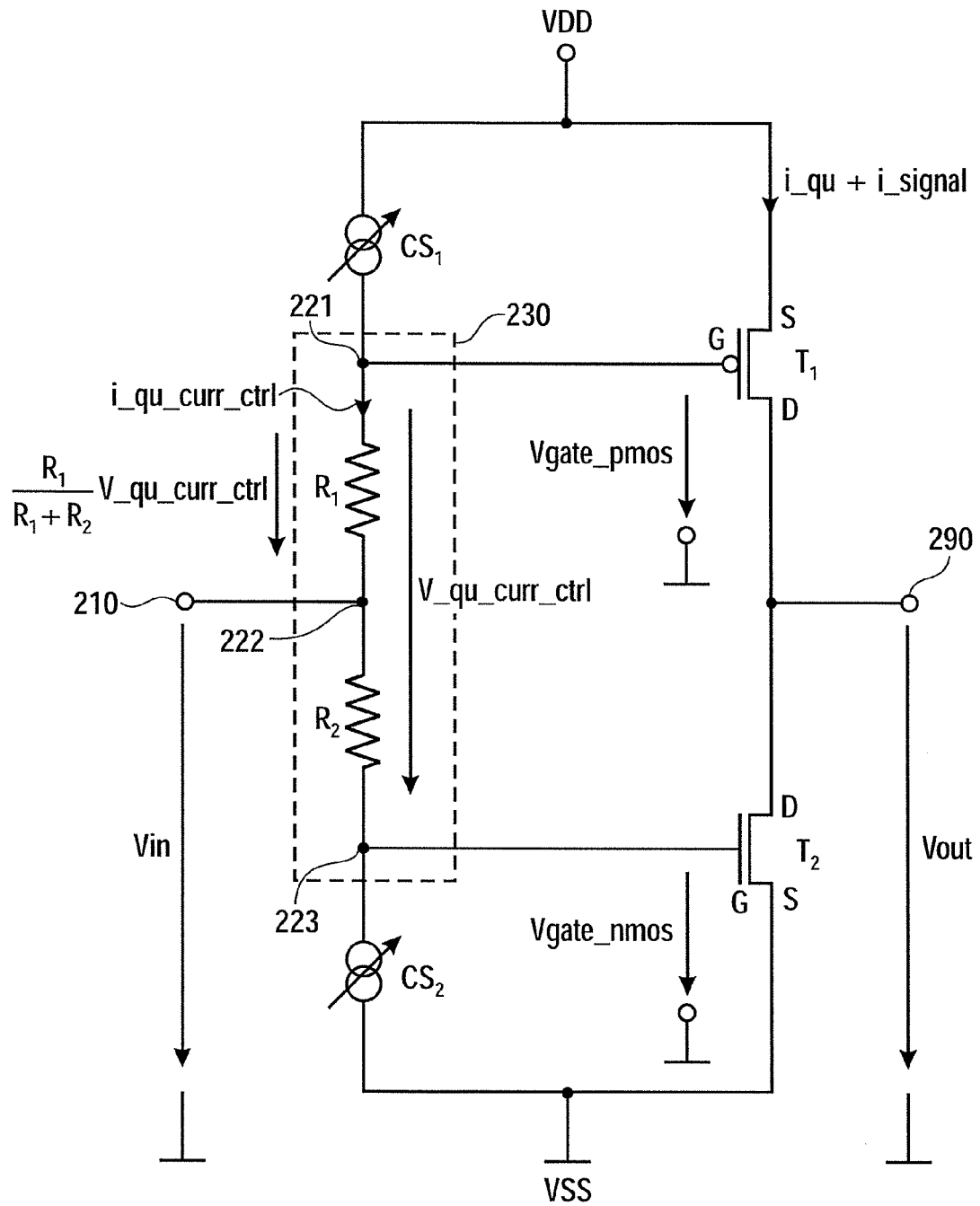
FIG. 2 shows a schematic circuit diagram of a push-pull amplifier for a single-ended signal and comprising a resistive series connection and a controllable current source arrangement for adjusting a quiescent current.

FIG. 2 shows a schematic circuit diagram of a single-ended push-pull amplifier comprising a biasing network for adjusting the quiescent current of the push-pull amplifier. The push-pull amplifier includes a first transistor T1 and a second transistor T2 in push-pull configuration. The transistors T1 and T2 are connected in series with respect to their main current paths. In FIG. 2, transistor T1 is a PMOS transistor (p-channel metal oxide semiconductor transistor) and the main current path corresponds to the channel of the transistor extending between a source terminal S and the drain terminal D. Transistor T2 is a NMOS transistor (n-channel metal oxide semiconductor transistor) and the main current path corresponds to the channel extending between a drain terminal D and a source terminal S of transistor T2.

Each of the two transistors T1 and T2 also includes a control terminal, here a gate G. The control terminals G are used for controlling a conduction of electric current among the main current path of the respective transistor T1 or T2. The control terminal G of the first transistor T1 is connected to a first terminal 211 of a series connection 230 of two resistors $R_1$ and $R_2$. The series connection 230 of two resistors further includes a second terminal 222 and a third terminal 223. The first resistor $R_1$ of the two resistors is connected between the first terminal 221 and the second terminal 222. The second resistor $R_2$ of the two resistors is connected between the second terminal 222 and the third terminal 223. The push-pull amplifier also includes an input node 210 which is connected to the second terminal 222 of the series connection 230 of the two resistors. Each of the two resistors $R_1$ and $R_2$ typically has a resistance that is larger than a resistance of a conducting line (e.g., a metallic connection or a connection of another conducting material) that may be used in a circuit implementing the push-pull amplifier shown in FIG. 2 and also in some of the following Figures. For example, the resistance of each of the two resistors $R_1$ and $R_2$ may be at least 5 micro-ohms, at least 10 micro-ohms, at least 20 micro-ohms, or at least 50 micro-ohms. The resistors $R_1$ and $R_2$ may be implemented on-chip or as external components. Each resistor $R_1$ and/or $R_2$ may include several basic resistive elements that are connected in series or in parallel or as a combination of a series connection and a parallel connection.

The biasing portion of the push-pull amplifier shown in FIG. 2 further includes a first controlled current source CS1 and a second controlled current source CS2. The first controlled current source CS1 is connected to the first terminal 221 of the series connection 230 for sourcing a first current to the series connection 230. The second controlled current source CS 2 is connected to the third terminal 223 of the series connection 230 for sinking a second current from the series connection 230. Typically, the first current and the second current are substantially equal and indicated in FIG. 2 by i_qu_curr_ctrl that flows through the series connection 230. This may be achieved by controlling the first and second controllable current sources CS1, CS2 in a coordinated manner. Typically, the control terminals of the transistor T1 and T2 conduct very weak currents, only, and also the input terminal 210 does not conduct any significant current.

An input signal Vin may be supplied to the push-pull amplifier via the input node 210 in the form of an input voltage Vin. The current i_qu_curr_ctrl generated by the first and second controlled current sources CS 1 and CS 2 causes the second terminal 222 to be at a certain voltage with respect to a ground potential, here for example VSS. Assuming the current i_qu_curr_ctrl to be positive, the first terminal 221 of the series connection 230 is at a higher voltage than the second terminal 222 and also than the input node 210, due to the voltage drop over the first resistor $R_1$ which is $R_1/(R_1+R_2)$ v_qu_curr_ctrl. The voltage v_qu_curr_ctrl is the total voltage drop over the series connection 230 of the two resistors $R_1$ and $R_2$. Due to the superposition principle, the input voltage Vin causes the second terminal 222 to substantially follow the input signal Vin. The voltage drops over the resistors $R_1$ and $R_2$ are governed by the current i_qu_curr_ctrl and therefore substantially constant as long as the current i_qu_curr_ctrl is constant. The same holds for the voltage drop over the second resistor R2. Accordingly the voltages of the first and third terminals 221, 223 of the series connection 230 substantially follow the input signal Vin, too. The first and second current sources CS1 and CS2 do not have a great influence on their own respective voltage drops. Rather, the voltage drop over the first current source CS1 is primarily determined by the remaining network to which current source CS 1 is connected. The same applies to the second current source CS 2.

The transistors T1 and T2 are of complementary type, here complementary MOS transistors with transistor T1 being a PMOS transistor and transistor T2 being a NMOS transistor. Furthermore, the control voltages Vgate_pmos and Vgate_nmos are offset with respect to each other by the voltage drop v_qu_curr_ctrl across the series connection 230 but otherwise parallel to each other, because both follow the input signal Vin. This means that as transistor T1 becomes more/less conducting, transistor T2 becomes less/more conducting, which in turn reduces/increases the output voltage Vout at an output node 290 of the push-pull amplifier. The total current through the two transistors T1 and T2 in push-pull configuration includes the quiescent current portion i_qu and a signal portion i_signal. According to an aspect of the invention it is desired to keep the quiescent current constant. However, temperature changes, process variations, supply voltage variations, and other external influences cause the quiescent current to vary to a degree that may lead to suboptimal performance of the push-pull amplifier, as in particular a class AB amplifier requires relatively precise biasing conditions in order to set the Q point close to cutoff. The combination of the series connection 230 and the first and second current sources CS1, CS2 provides the possibility to vary the biasing conditions of the first and second transistors T1 and T2 in order to adjust the quiescent current to a desired level.

Figure 3:
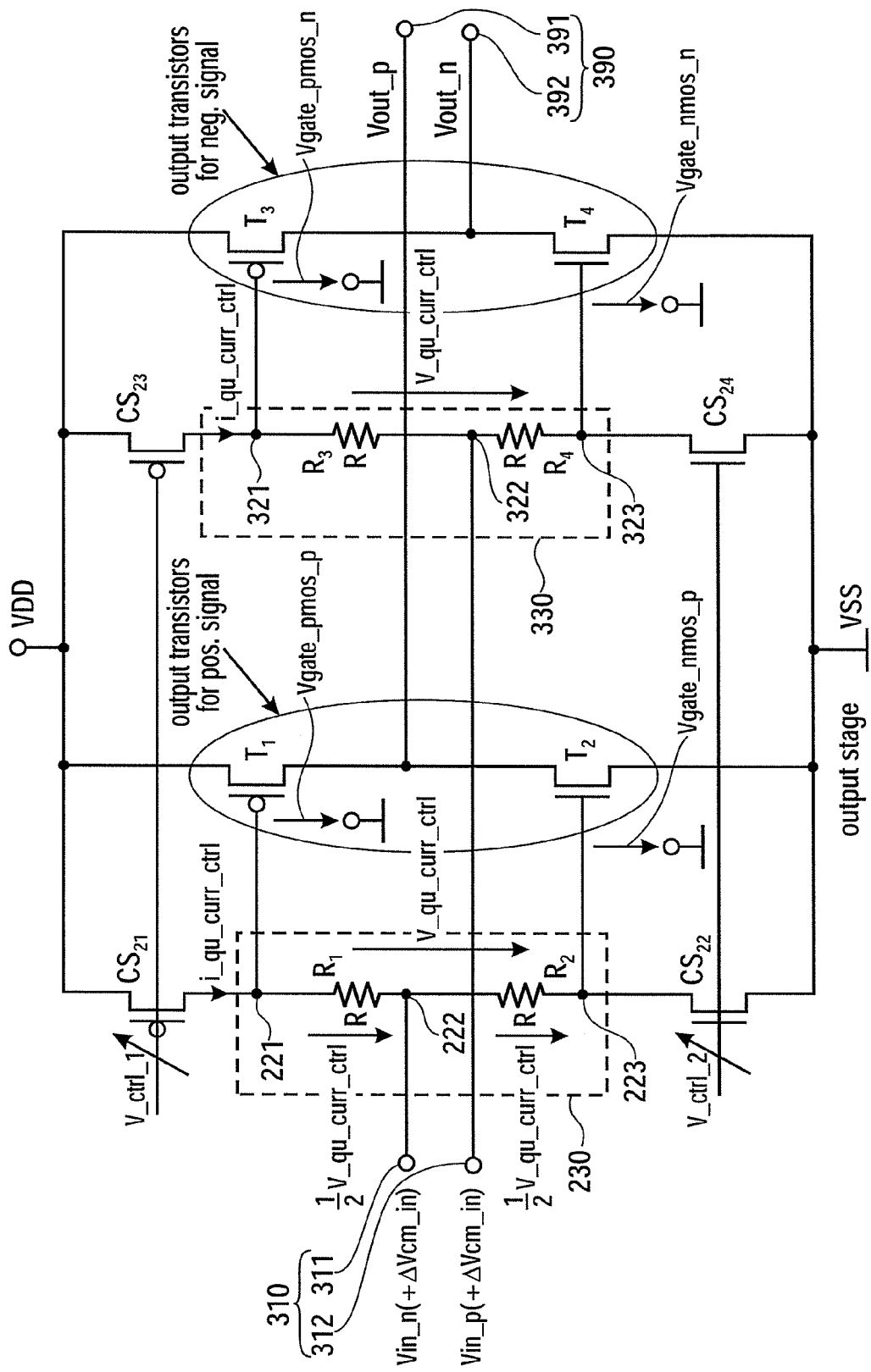
FIG. 3 shows a schematic circuit diagram of a push-pull amplifier for differential signals featuring an adjustable quiescent current.

FIG. 2 shows an implementation example without constant biasing offset current which will be introduced in FIG. 3. The offset voltage control range is inherently smaller in the implementation example of FIG. 2 compared to the implementation examples of FIGS. 3 to 5, but the circuit in FIG. 2 is relatively simpler, the noise contribution of the biasing concept is relatively lower and the current consumption is relatively smaller due to the missing fixed offset current.

The amplifier schematically depicted in FIG. 2 may be used as a push-pull class AB operational amplifier output stage. The amplifier includes quiescent current control and common mode output voltage control. The amplifier can handle a large process, temperature and supply voltage variation with completely independent control of the quiescent current in the push-pull output stage and the common mode output voltage. The output swing is substantially full VDD/VSS rail-to-rail without any major limitations.

Due to a completely independent common mode output voltage control and quiescent current control with a very large control range, the proposed push-pull amplifier is able to provide one or more of:
  a) very accurate quiescent current substantially without temperature and process influence.
  b) nearly VDD/VSS rail-to-rail output swing (almost) without any limitations.
  c) A very large control range of the quiescent current and common mode voltage.

As described above and schematically illustrated in FIG. 2, at least one aspect of the invention relates to a resistive network with current sources CS1, CS2 in front of a PMOS/NMOS inverter stage to achieve a voltage v_qu_curr_ctrl across the two series resistors $R_1$, $R_2$. This voltage v_qu_curr_ctrl works as an offset voltage to the input voltage Vin (or the common mode input voltage in the case of a differential design described below in connection with FIGS. 3 to 5) of the push-pull amplifier, which may be used as an output stage. The common mode input voltage leads to a correct quotient of Ron_nmos/Ron_pmos, i.e., the quotient of the on-resistances of the NMOS and PMOS transistors, which leads to the wanted common mode output voltage.

In one example implemenetation, the inventors built an operational amplifier class AB output stage in C28 (28 nanometers) CMOS technology according to the amplifier of FIG. 2.

FIG. 3 shows a differential implementation example of a push-pull amplifier. The push-pull amplifier has a further input node 312 so that the input node 311 and the further input node form a differential input 310. The push-pull amplifier graphically illustrated in FIG. 3 also includes a differential output 390 comprising an output node 391 and a further output node 392. A further series connection 330 of two further resistors R3 and R4 is also provided. The further series connection 330 has a further first terminal 321, a further second terminal 322, and a further third terminal 323. The first resistor R3 of the two further resistors R3, R4 is connected between the further first terminal 321 and the further second terminal 322. The second resistor R4 of the two further resistors is connected between a further second terminal 322 and the further third terminal 323. The further input node 312 is connected to the further second terminal 322. A further first controllable current source CS23 is connected to the further first terminal 321 of the further series connection 330 for sourcing a further first current to the further series connection 330. A further second controlled current source CS24 is connected to the further third terminal of the further series connection 330 for sinking a further second current from the further series connection 330. In the implementation example schematically illustrated in FIG. 3, the first current and the further first current are substantially equal, namely i_qu_curr_ctrl. Furthermore, the push-pull amplifier shown in FIG. 3 includes a further first transistor T3 and a further second transistor T4 in push-pull configuration. A control input of the further first transistor T3 is connected to the further first terminal 321 of the further series connection 330. A control input of the further second transistor T4 is connected to the further third terminal 323 of the further series connection 330. An output signal generated by the first and second transistors T1, T2 and a further output signal generated by the third first and second transistors T3, T4 form a differential output signal available at the differential output 390.

The controllable current sources CS21, CS22, CS23, and CS24 are implemented as MOS transistors in the implementation example of FIG. 3. Other implementations of controlled current sources are also possible. The first controlled current source CS21 and the further first controlled current source CS23 each include a PMOS transistor which are controlled by a common quiescent current control signal V_ctrl_1. The second controlled current source CS22 and the further second controlled current source CS24 are implemented as NMOS transistors and are controlled by a second quiescent current control voltage V_ctrl_2.

The four resistors R1 to R4 are equal (resistance R) in the implementation example shown in FIG. 3. Accordingly, the voltage drop over each resistor equals one half of the offset voltage v_qu_curr_ctrl between the control terminals of the transistors T1 and T2, and also between the control terminals of the further transistors T3 and T4. The gate voltages of the transistors T1, T2, T3, and T4 are designated in FIG. 3 by Vgate_pmos_p, Vgate_nmos_p, Vgate_pmos_n, and Vgate_nmos_n, respectively.

The first transistor T1 and the second transistor T2 are the output transistors for the "positive signal" Vout_p of the differential output signal (the designation "positive signal" is according to definition; indeed, the "positive signal" may temporarily become negative relative to a output signal common mode voltage, as well). The further first transistor T3 and the further second transistor T4 are the output transistors for a "negative signal" Vout_n of the differential output signal (again, by definition: the "negative signal" Vout_n may temporarily become positive relative to the common mode output signal. Furthermore, the "negative signal" Vout_n may be temporarily greater than the "positive signal" Vout_p). The differential output signal comprising the positive signal Vout_p and the negative signal Vout_n has a common mode output voltage relative to the ground potential VSS. In a similar manner, also the differential input signal comprising the positive input signal Vin_p and the negative input signal Vin_n have a common mode input voltage. Optionally, the common mode input voltage may be adjusted by adding a correctional common mode input voltage ΔVcm_in to both the positive input signal and the negative input signal.

Figure 4:
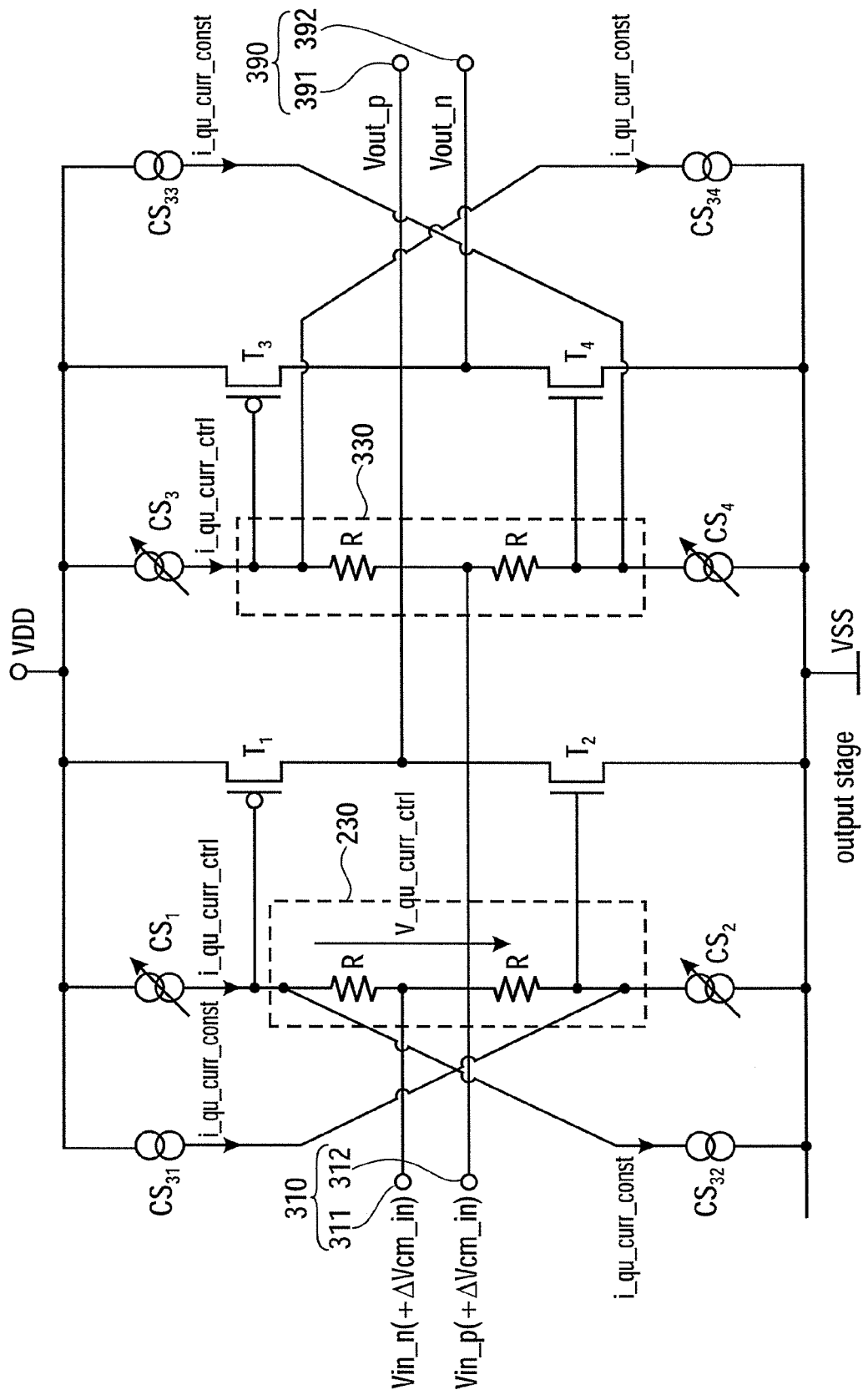
FIG. 4 shows a schematic circuit diagram of a push-pull amplifier for differential signals comprising a sub-circuit for generating constant biasing offset currents for increased achievable control range of the quiescent current and/or of the common mode output voltage.

By adding the mentioned offset voltage v_qu_curr_ctrl, the quiescent current through the NMOS and PMOS transistors is regulated without changing Ron_nmos/Ron_pmos. However, the variable i_qu_curr_ctrl is only able to deliver a single signed offset voltage. The additional employment of a fixed bias current in the opposite direction i_qu_curr_const makes it possible to ensure a certain positive and negative offset voltage control range. This increases the achievable control range of the quiescent current and common mode output voltage. FIG. 4 shows a corresponding implementation example.

In particular, FIG. 4 shows an implementation example with constant biasing offset current to provide a positive and negative offset voltage control range. The push-pull amplifier in FIG. 4 is similar to the push-pull amplifier shown in FIG. 3. In FIG. 4, generic controllable current sources CS1, CS2, CS3, and CS4 are depicted instead of the CMOS-implemented current sources CS21, CS22, CS23, and CS 24 in FIG. 3. Furthermore, the push-pull amplifier shown in FIG. 4 further includes additional constant current sources CS31, CS32, CS33, and CS34 for sourcing and sinking constant currents i_qu_curr_const to the series connections 230 and 330.

The constant current source CS31 is connected to the third terminal of the series connection 230 and sources the constant current i_qu_curr_const to the series connection in an inverse manner, so that the constant current i_qu_curr_const flows from the third terminal to the first terminal of the series connection 230. The second constant current sources CS32 is connected to the first terminal of the series connection 230 of two resistors $R_1$ and $R_2$ for sinking the constant current i_qu_curr_const from the series connection 230.

A further constant current source CS33 is connected to the third terminal of the further series connection 330. A further second current source is connected to the first terminal of the further series connection 330. In this manner, a constant current i_qu_const_curr flows in an inverse direction through the further series connection, namely from the further third terminal to the further first terminal.

In both the series connection 230 and the further series connection 330 the negative constant current −i_qu_curr_const and the control current i_qu_curr_ctrl add up so that the current that flows through the series connection 230 is:

i_qu_curr_ctrl−i_qu_curr_const.

In this manner, the total current can become negative even though the controllable current sources CS1 to CS4 provide positive currents (that flow from VDD to VSS).

Figure 5:
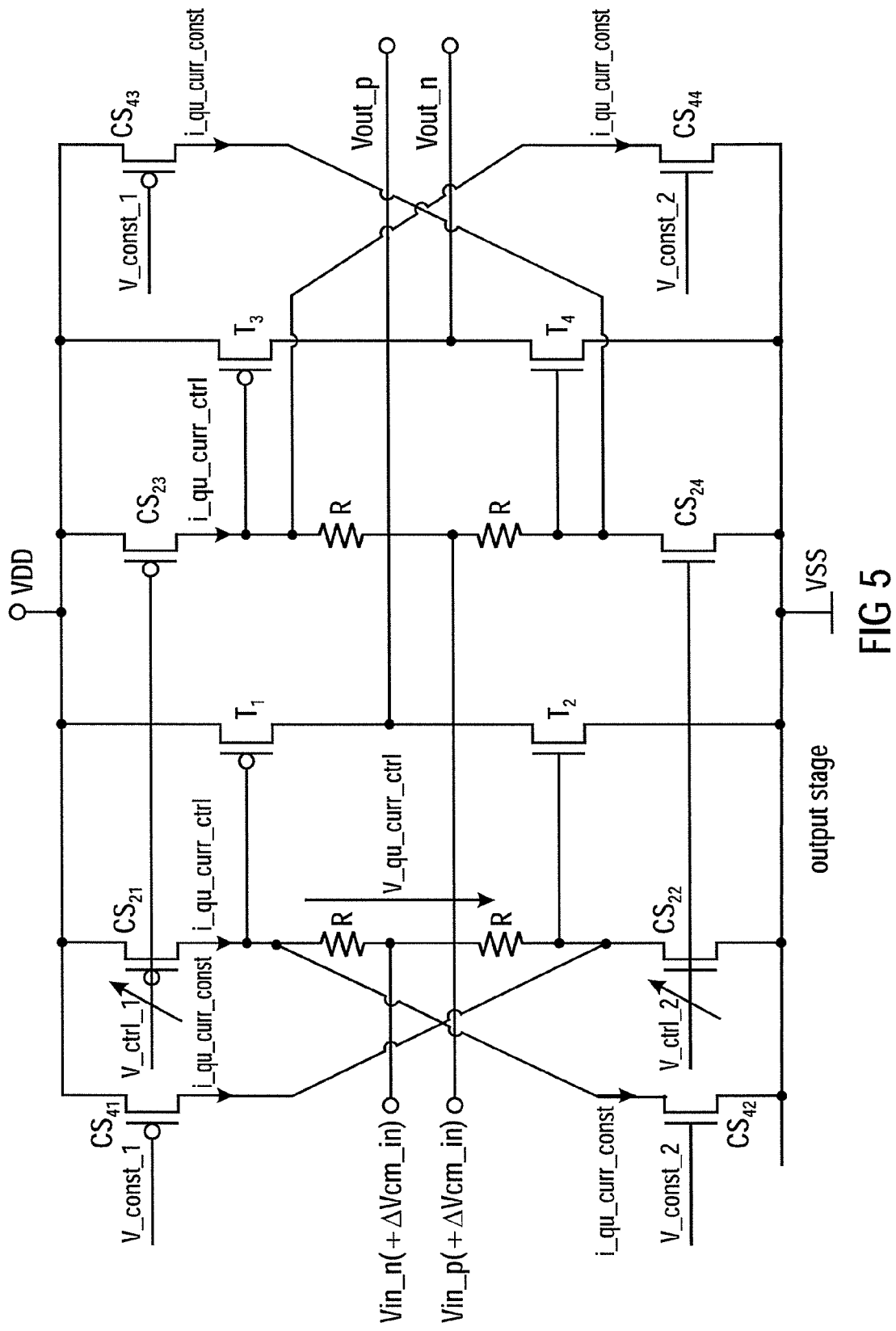
FIG. 5 shows a schematic circuit diagram of a push-pull amplifier for differential signals similar to FIG. 4 illustrating a concrete implementation example for the current sources.

FIG. 5 is a schematic diagram of a push-pull amplifier similar to FIG. 4. In FIG. 5 the generic controllable current sources CS1 to CS4 have been replaced by CMOS-implemented controllable current sources CS21 to CS24. Furthermore, the generic constant current sources CS31 to CS34 in FIG. 4 have been replaced by CMOS-implemented constant current sources CS41 to CS44.

Figure 6:
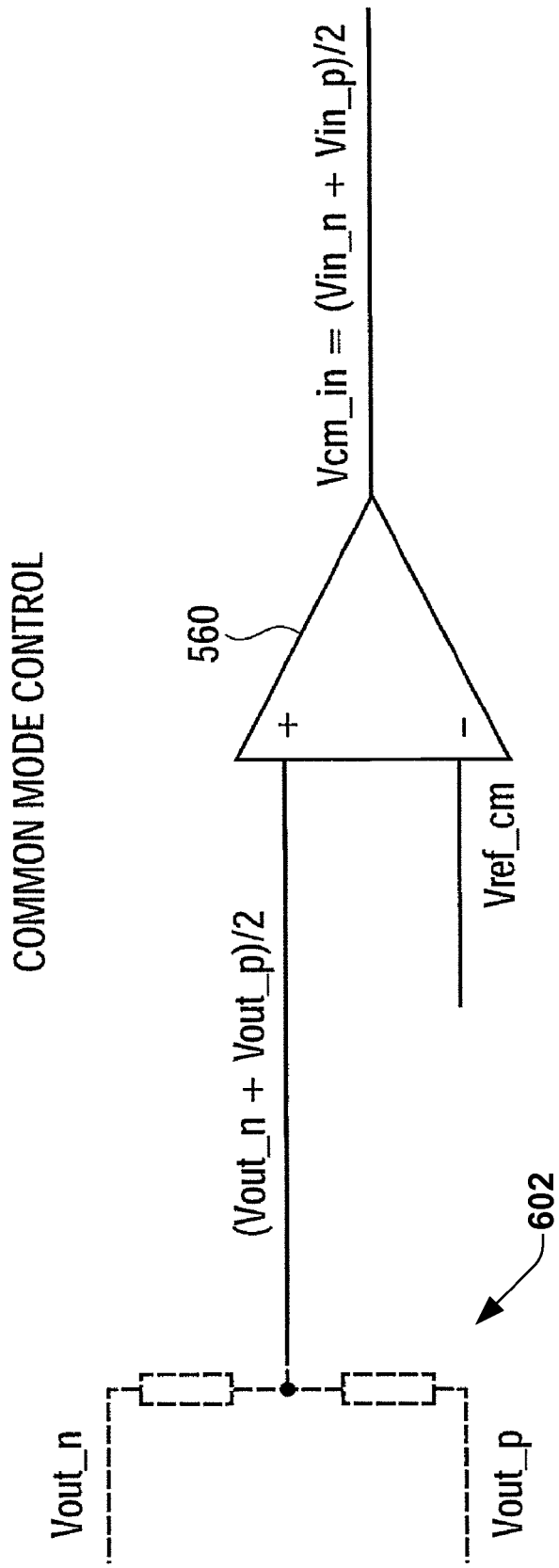
FIG. 6 shows a schematic circuit diagram of a sub-circuit for common mode control input in an amplification system.

FIG. 6 shows a schematic circuit diagram of a sub-circuit for common mode control input in an amplification system. The sub-circuit includes an operational amplifier 560 and a combination network 602 of two resistors for feeding the common-mode output voltage to the non-inverting input of the operational amplifier. The combination network of the two resistors uses Vout_n and Vout_p to generate (Vout_n+Vout_p)/2, which is provided at the non-inverting input of the amplifier 560. The input common-mode voltage of the output stage (Vcm_in) is controlled in that way that the common-mode output voltage ((Vout_n+Vout_p)/2) is equal to a certain reference voltage (Vref_cm) applied to an inverting input of the operational amplifier 560. This may be achieved by using a level shifter for adding the correctional input common-mode voltage ΔVin_cm mentioned above to the positive and negative signals Vin_p and Vin_n of the input signal, i.e., Vin_p+ΔVin_cm and Vin_n+ΔVin_cm.

Figure 7:
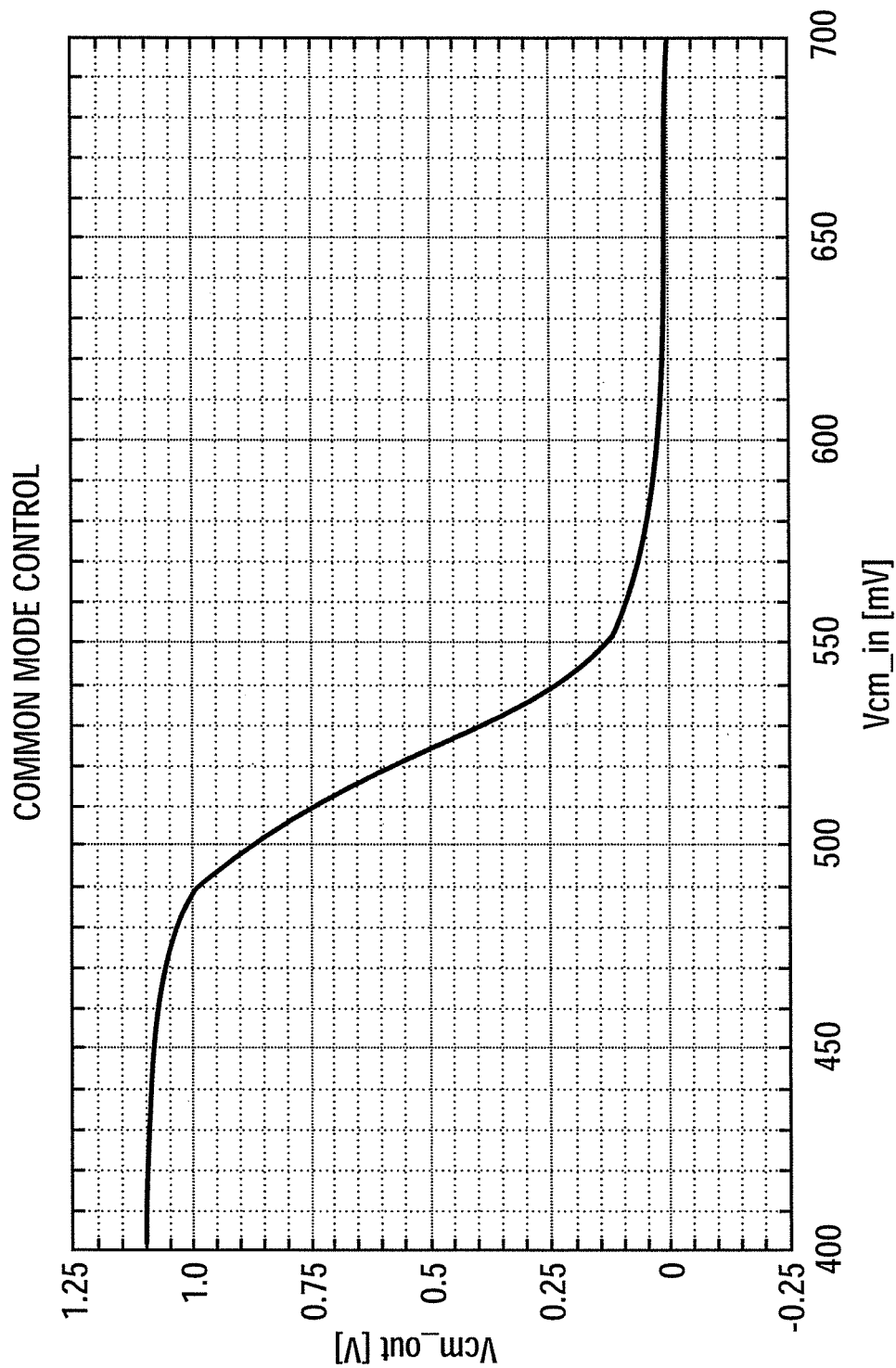
FIG. 7 graphically illustrates a dependence of a common mode voltage at an output of a differential push-pull amplifier over the common mode voltage of the input signal.

FIG. 7 graphically illustrates a dependence of a common mode voltage at an output of a differential push-pull amplifier over the common-mode voltage of the input signal. It can be seen that a low input common-mode voltage Vcm_in causes the output common-mode voltage Vcm_out to be close to a maximal value of 1.1V in the depicted example. With increasing common-mode voltage Vcm_in of the input signal, the common-mode voltage Vcm_out of the output signal decreases until it eventually approaches zero.

Figure 8:
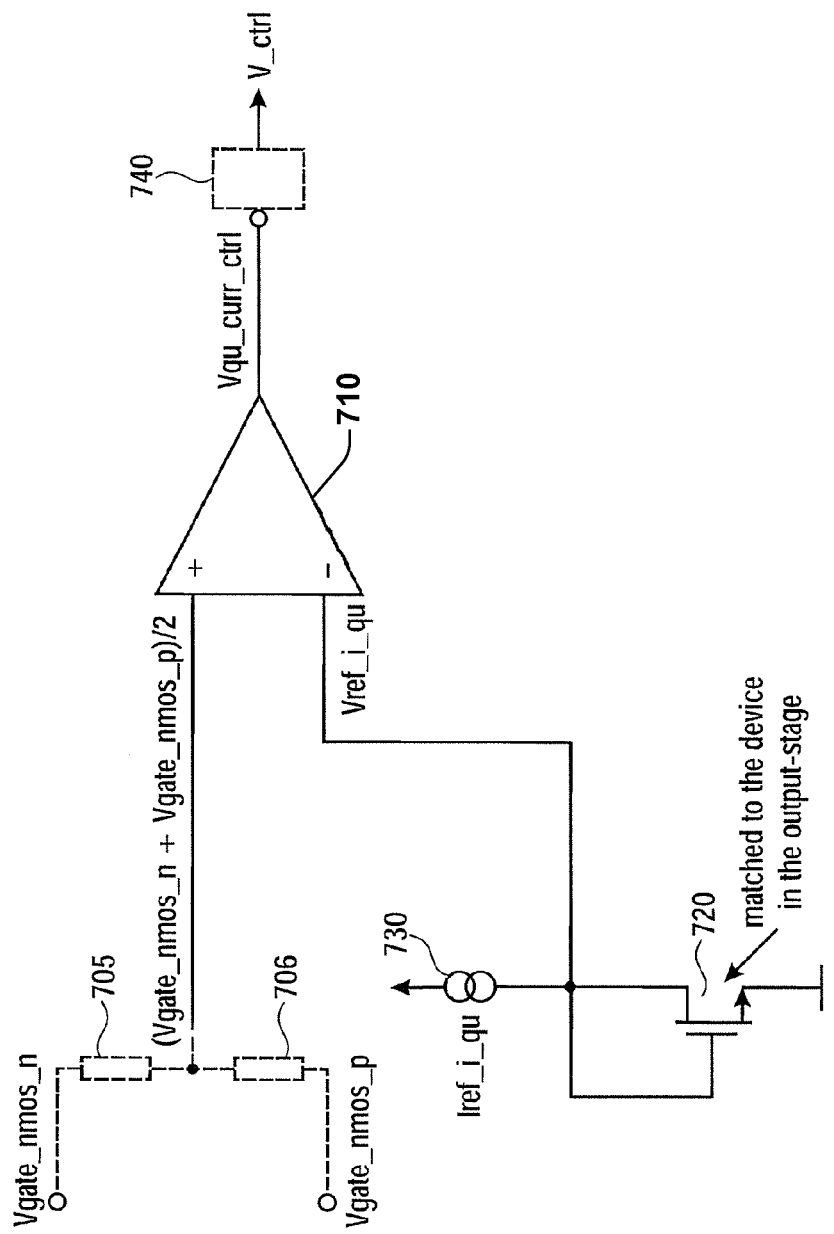
FIG. 8 shows a schematic circuit diagram of a sub-circuit for quiescent current control in an amplification system.

FIG. 8 shows a schematic circuit diagram of a sub-circuit for quiescent current control in an amplification system. The quiescent control voltage (Vqu_curr_ctrl) is controlled in that way that the common-mode voltage at the gates of the NMOS transistors in the output stage is equal to a certain reference voltage (Vref_i_qu). The sub-circuit includes a resistive network with resistors 705 and 706 for determining the average voltage of the two gate voltages Vgate_nmos_n and Vgate_nmos_p, i.e. (Vgate_nmos_n+Vgate_nmos_p)/2. This average voltage is applied to the non-inverting input of an operational amplifier 710. The reference voltage Vref_i_qu is applied to the inverting input of the operational amplifier 710. The reference voltage Vref_i_qu is generated by the help of a matched NMOS transistor 720 biased with a current Iref_i_qu. The current Iref_i_qu is provided by a current source 730. The sub-circuit shown in FIG. 8 may also be implemented for the PMOS transistors T1 and T3 in an analogous manner. The output of the operational amplifier 710 may be connected to a converting circuit 740 for producing the control voltage V_ctrl (or V_ctrl_2) on the basis of the quiescent control voltage Vqu_curr_ctrl. Alternatively, the quiescent control voltage Vqu_curr_ctrl may be used as the control voltage V_ctrl (or V_ctrl_2) directly.

FIG. 8 may also be described as follows: The push-pull amplifier further includes a quiescent current control circuit for generating at least one control signal V_ctrl (or V_ctrl_1 and/or V_ctrl_2) for the first and second controllable current sources CS1, CS2 and for thereby controlling a quiescent current i_qu of the first and second transistors T1, T2. The push-pull amplifier further includes a feedback line from the control input of the first transistor or the second transistor to the quiescent current control circuit.

The quiescent current control circuit may further include a matched transistor 720 that is matched to one of the first transistor T1 and the second transistor T2 and connected in a diode configuration. The quiescent current control circuit may also have a reference current source 730 for generating a reference quiescent current Iref_i_qu and for feeding the reference quiescent current to the matched transistor 730. A difference signal circuit 710 may be provided, a first input of which is connected to a node between the matched transistor 720 and the reference current source 730 and a second input of which is connected to the feedback line, here the node between the resistors 705 and 706. A difference signal between the first and second inputs of the difference signal circuit 710 is generated and provided to the first and second controllable current sources CS1, CS2 as the at least one control signal. The difference signal circuit 710 may be configured to amplify the difference signal.

Figure 9:
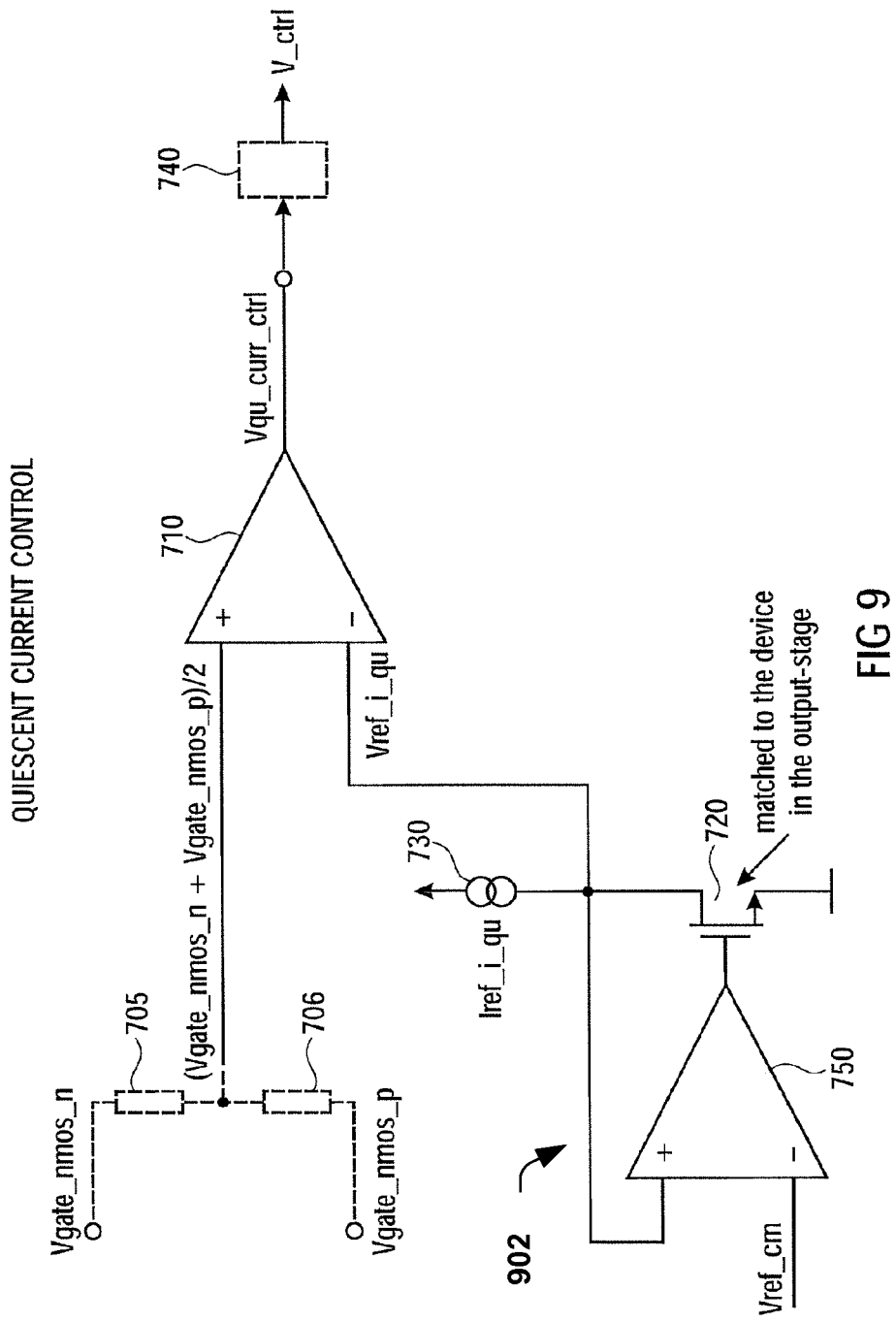
FIG. 9 shows a schematic circuit diagram of an alternative sub-circuit for quiescent current control in an amplification system.

FIG. 9 shows a schematic circuit diagram of an alternative sub-circuit for quiescent current control in an amplification system. In this version, compared to FIG. 8, the reference voltage (Vref_i_qu) is generated by the help of an additional control loop 902, which assures that the drain-source voltage of the matched device is equal to the drain-source voltage of the device in the output-stage. The additional control loop includes a further operational amplifier 750 that receives the reference voltage Vref_cm at its inverting input and the voltage of the NMOS transistor 720 at its non-inverting input. In other words, the quiescent current control circuit may further include an additional control loop for tracking a drain-source voltage or a base-emitter voltage of the matched transistor to be substantially equal to a drain-source voltage or a base-emitter voltage of the first transistor T1 or the second transistor T2.

Figure 10:
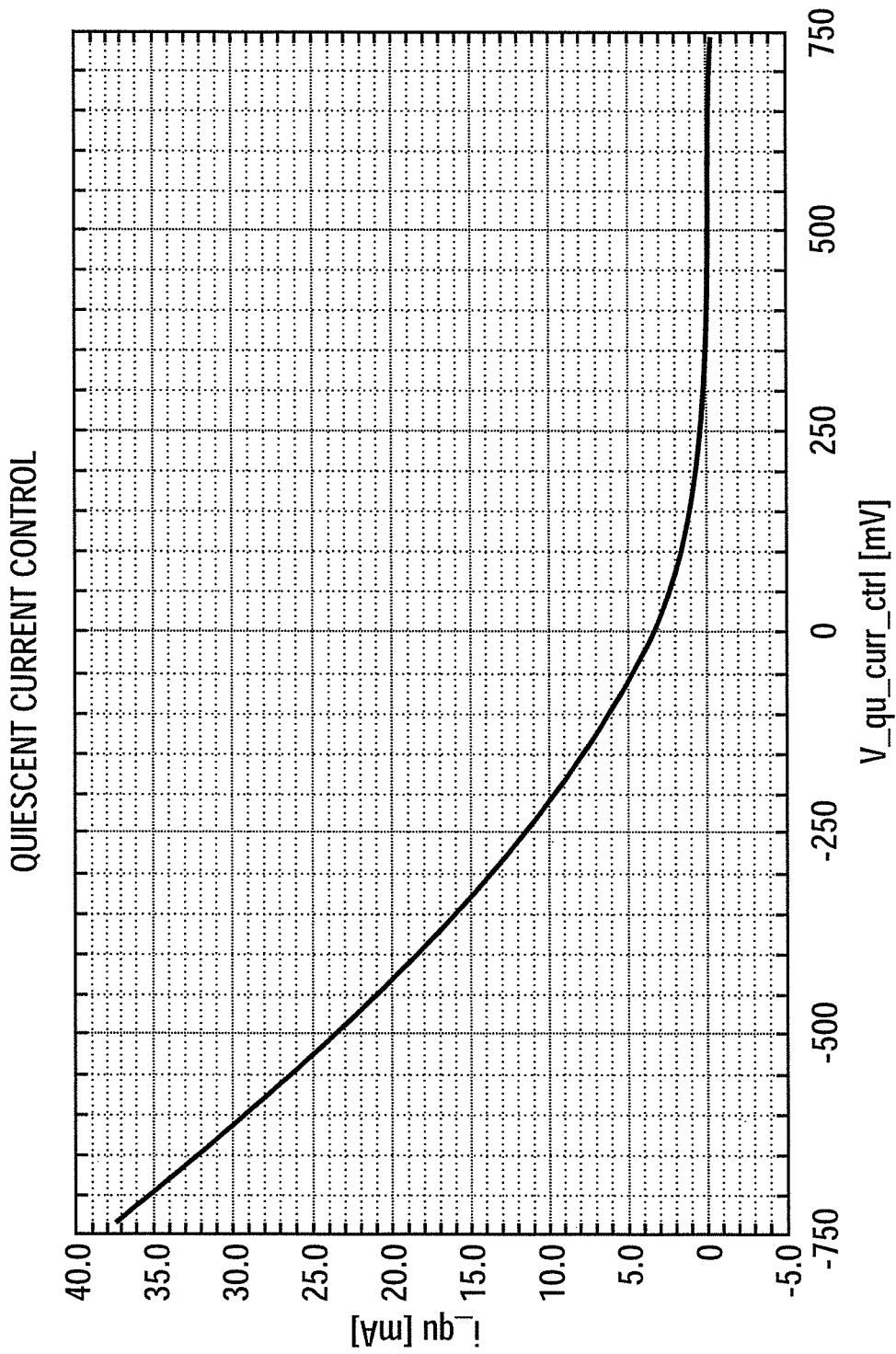
FIG. 10 graphically illustrates a dependence of the quiescent current over a quiescent current control voltage.

FIG. 10 graphically illustrates a dependence of the quiescent current i_qu over a quiescent current control voltage V_qu_curr_ctrl. It can be seen that for a sufficiently high quiescent current control voltage V_qu_curr_ctrl the quiescent current i_qu becomes substantially zero which means that both transistors T1 and T2 (and/or transistors T3 and T4) have been substantially switched off. However, the push-pull amplifier would not amplify the input signal in this case, anymore. Therefore, the quiescent current control voltage V_qu_curr_ctrl is typically chosen to be somewhat smaller, for example between −250 mV and 0 mV so that, for example, a quiescent current between 1 µA and 10 mA (other examples: 10 µA . . . 5 mA, or 25 µA . . . 1 mA, or 50 µA . . . 800 µA, or 80 µA . . . 500 µA, or 100 µA . . . 400 µA, or other ranges outside the indicated ranges) can be obtained.

Figure 11:
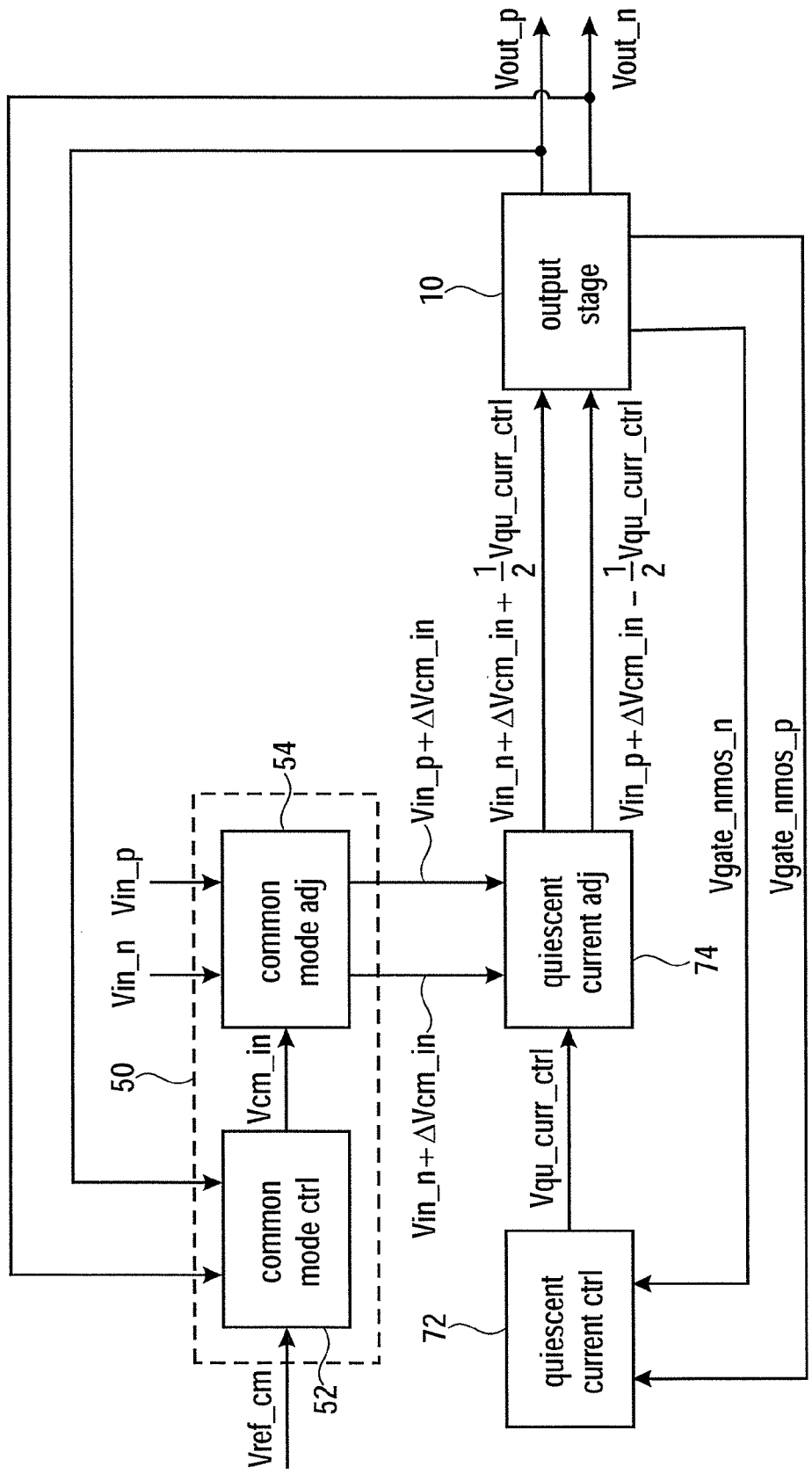
FIG. 11 shows a schematic block diagram of a closed loop amplification system with common mode control and quiescent current control.

FIG. 11 shows a schematic block diagram of a closed loop amplification system with common mode control and quiescent current control. The input signal is a differential signal having a positive signal Vin_p and a negative signal Vin_n. The differential input signal is fed to a common mode adjustment 54. Another input for the common mode adjustment 54 is a desired common-mode voltage Vcm_in of the input signal. This desired common-mode voltage Vcm_in of the input signal is generated by a common mode controller 52 on the basis of a feedback of the output signal having positive and negative signals Vout_p and Vout_n, and on the basis of a reference common-mode voltage Vref_cm for the output signal. The common-mode controller 52 and the common-mode adjustment are part of a common-mode sub-circuit 50. The common mode sub-circuit 50 outputs the common-mode corrected positive and negative signals of the input signal, namely Vin_n+ΔVcm_in and Vin_p+ΔVcm_in, which are provided to a quiescent current adjuster 74.

The quiescent current adjuster 74 further receives quiescent control voltage Vqu_curr_ctrl from a quiescent current controller (quiescent current control circuit) 72. The quiescent current controller 72 receives, via a feedback circuit, the control signals Vgate_nmos_n and Vgate_nmos_p of the transistor T1 and T3. Optionally, the quiescent current controller 72 may receive a reference current Iref_i_qu and/or the reference common-mode voltage Vref_cm for the output signal. As another option, the quiescent current controller 72 may be configured to generated the reference current Iref_i_qu on its own.

The quiescent current adjuster 74 generates the input signals for the out-put stage 10, namely Vin_n+ΔVcm_in+Vqu_curr_ctrl/2 and

Vin_p+ΔVcm_in−Vqu_curr_ctrl/2.

The output stage 10 provides the positive and negative signals Vout_p and Vout_n of the differential output signal at its output.

Figure 12:
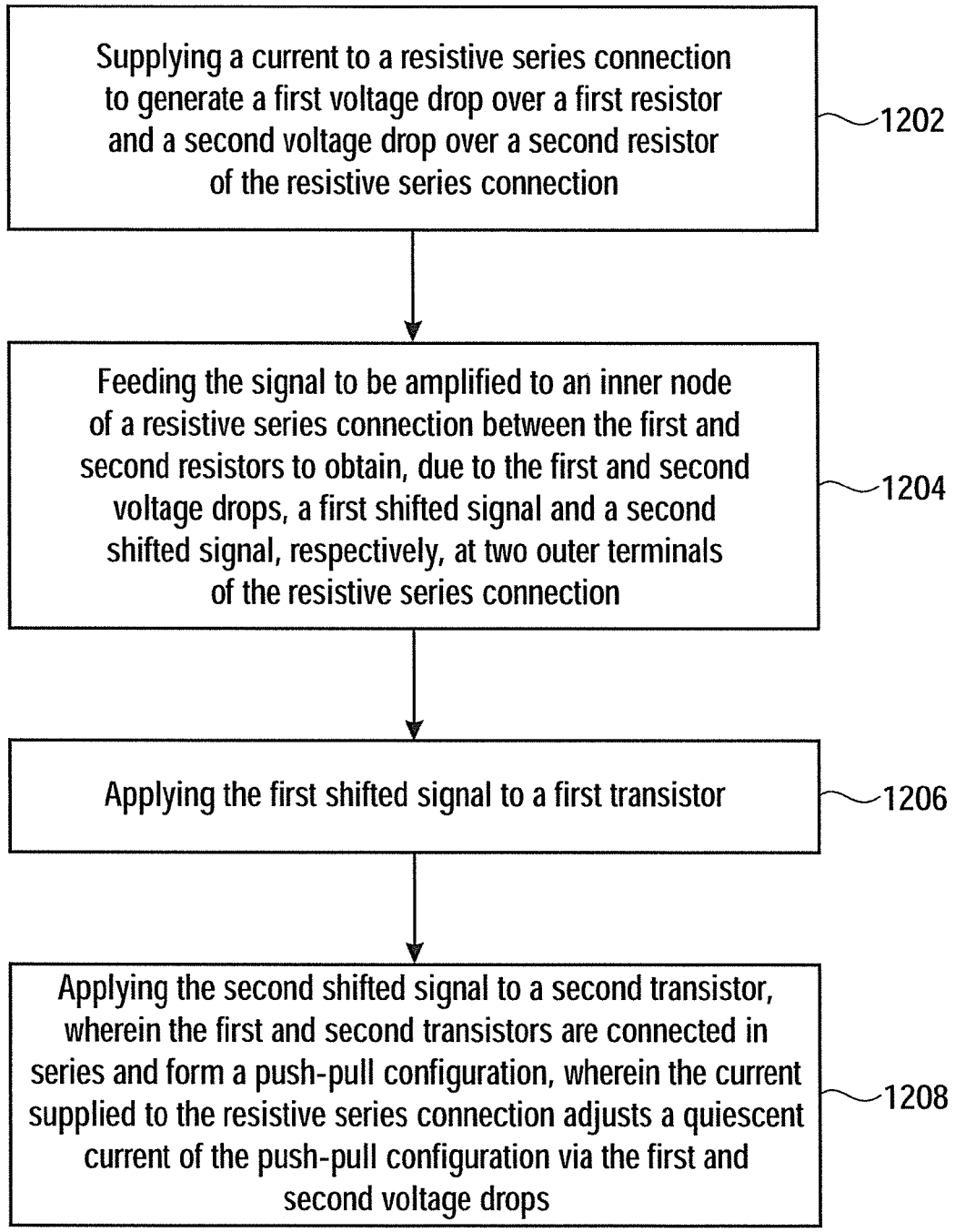
FIG. 12 shows a schematic flow diagram of a method for amplifying a signal with quiescent current adjustment.

FIG. 12 shows a schematic flow diagram of a method for amplifying a signal with quiescent current adjustment. The method includes a block 1202 of supplying a current to a resistive series connection to generate a first voltage drop over a first resistor and a second voltage drop over a second resistor of the resistive series connection. As indicated at block 1204 the signal to be amplified is then fed to an inner node of a resistive series connection between the first and second resistors to obtain, due to the first and second voltage drops, a first shifted signal and a second shifted signal, respectively, at two outer terminals of the resistive series connection. The method further includes a block 1206 of applying the first shifted signal to a first transistor. Likewise, the second shifted signal is applied to a second transistor, at a block 1208. The first and second transistors are connected in series and form a push-pull configuration. The current supplied to the resistive series connection adjusts a quiescent current of the push-pull configuration via the first and second voltage drops.

The block 1202 of supplying the current to the resistive series connection may further include a determination of a current source arrangement control signal on the basis of at least a reference quiescent current signal. The current source arrangement control signal may then be applied to a current source arrangement to generate the current to be supplied to the resistive series connection.

Furthermore, supplying the current to the resistive series connection according to block 1202 may further include receiving a feedback signal from at least one of the first and second transistors. The current source arrangement control signal may be determined on the basis of the reference quiescent current signal and the feedback signal.

The signal to be amplified may be a part of a pair of differential signals. In this case the method may further include: supplying a further current to a further resistive series connection to generate a further first voltage drop over a further first resistor and a further second voltage drop over a further second resistor of the further resistive series connection. The other signal of the pair of differential signals may be fed to a further inner node of a further resistive series connection between the further first and further second resistors to obtain, due to the further first and further second voltage drops, a further first shifted signal and a further second shifted signal, respectively, at two outer terminals of the further resistive series connection. The method may also include applying the further first shifted signal to a further first transistor, and a step of applying the further second shifted signal to a further second transistor, wherein the further first and further second transistors are connected in series and form a further push-pull configuration. The further current supplied to the further resistive series connection may adjust a quiescent current of the further push-pull configuration via the further first and further second voltage drops. The push-pull configuration and the further push-pull configuration may generate a pair of differential output signals.

According to further variations of the method a common mode of the pair of signals to be amplified may be adjusted. According to at least some variations, adjusting the common mode is independent from controlling the quiescent current.

Figure 13:
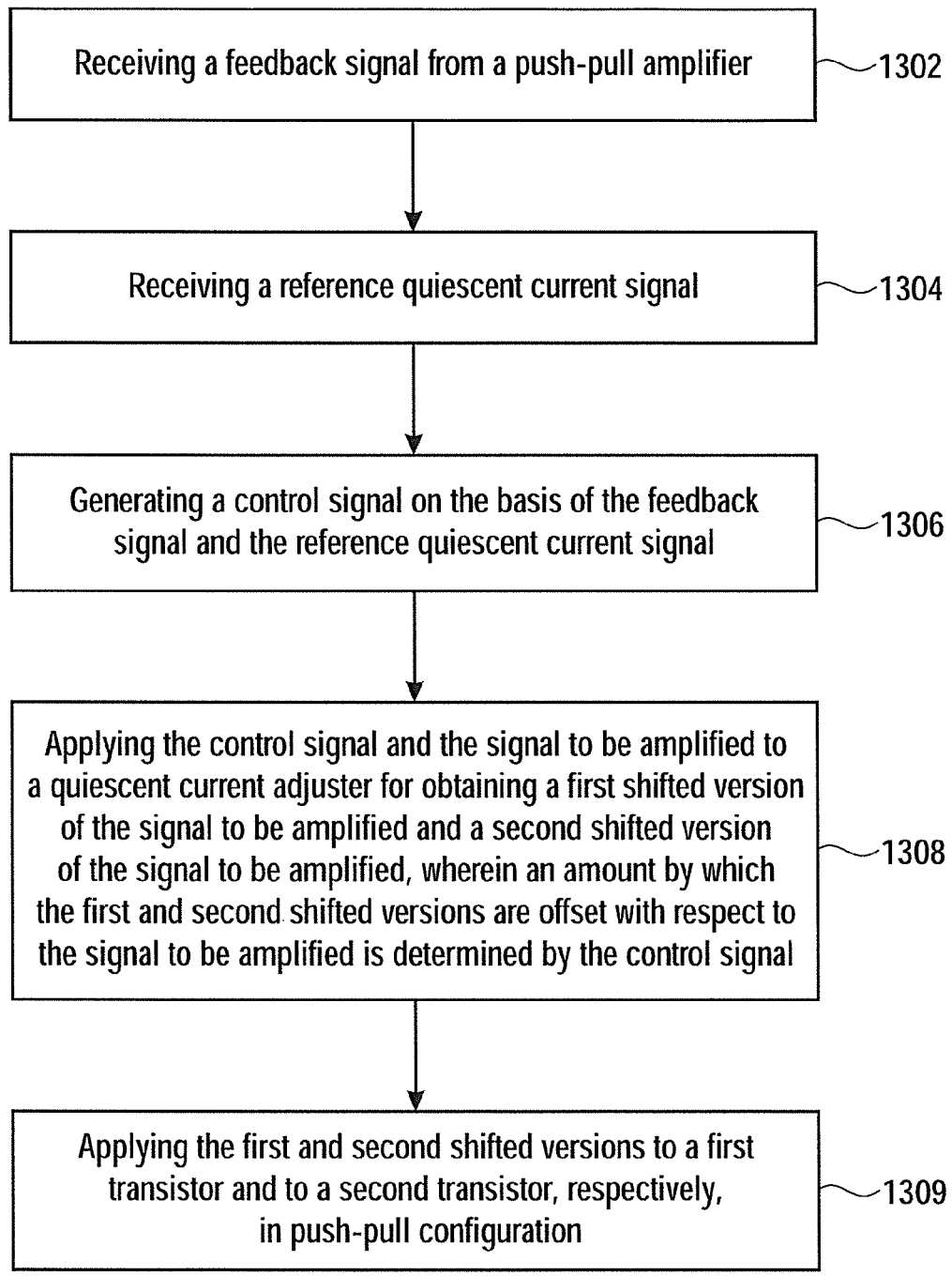
FIG. 13 shows a schematic flow diagram of another method for amplifying a signal with quiescent current adjustment.

FIG. 13 shows a schematic flow diagram of another method for amplifying a signal with quiescent current adjustment. The method includes a block 1302 of receiving a feedback signal from a push-pull amplifier. At a block 1304 a reference quiescent current signal is received. A control signal is generated on the basis of the feedback signal and the reference quiescent current signal at a block 1306. According to block 1308, the control signal and the signal to be amplified are applied to a quiescent current adjuster for obtaining a first shifted version of the signal to be amplified and a second shifted version of the signal to be amplified. An amount by which the first and second shifted versions are offset with respect to the signal to be amplified is determined by the control signal. The method also includes a block 1309 of applying the first and second shifted versions to a first transistor and to a second transistor, respectively. The first and second transistors are connected in a push-pull configuration.

According to a variation of the method, the signal to be amplified may belong to a pair of differential signals and the method may generate a pair of amplified differential signals. In this case the method may further include: feeding back the pair of amplified differential signals and controlling a common mode of the pair of differential signals. The common mode of the pair of differential signals may be performed on the basis of the pair of amplified differential signals and a reference common mode signal (e.g., a reference common mode voltage), in order to reduce a deviation between a common mode of the pair of amplified differential signals and the reference common mode signal.

A push-pull amplifier is disclosed and includes an input node, a series connection of two resistors, a first controlled current source, a second controlled current source, and a first transistor and a second transistor in push-pull configuration. The series connection of two resistors includes a first terminal, a second terminal, and a third terminal. A first resistor of the two resistors is connected between the first terminal and the second terminal. A second resistor of the two resistors is connected between the second terminal and the third terminal. The input node is connected to the second terminal. The first controllable current source is connected to the first terminal of the series connection for sourcing a first current to the series connection. The second controlled current source is connected to the third terminal of the series connection for sinking a second current from the series connection. With respect to the first transistor and the second transistor in push-pull configuration, a control input of the first transistor is connected to the first terminal of the series connection and a control input of the second transistor is connected to the third terminal of the series connection.

An amplification system is disclosed which has a push-pull amplifier, a feedback line, a quiescent current control circuit, and a quiescent current adjuster. The feedback line is provided for feeding back a feedback signal from the push-pull amplifier. The quiescent current control circuit is provided for receiving the feedback signal and a reference quiescent current signal. It is further provided for generating a control signal on the basis of the feedback signal and the reference quiescent current signal. The quiescent current adjuster includes a resistive series connection and a controllable current source arrangement for causing a current through the resistive series connection in response to the control signal. An inner node of the resistive series connection is provided for receiving a signal to be amplified by the push-pull amplifier. Two outer terminals of the resistive series connection are connected to control terminals of a first portion and a second complementary portion, respectively, of the push-pull amplifier.

Furthermore, the present disclosure, including methods, systems, amplfiers, and variations thereof, relates to a mobile communication device comprising an antenna port, an RF front end, and a digital baseband processor. Furthermore, the mobile communication device includes a push-pull amplifier for an amplification arrangement as described above. Such a push-pull amplifier or amplification arrangement is comprised in the RF front end. Furthermore, the RF front end of the mobile communication device is coupled to the antenna port and the digital baseband processor of the mobile communication device.

Further the disclosure provides a method for amplifying a signal, the method comprising supplying a current to a resistive series connection to generate a first voltage drop over a first resistor and a second voltage drop over a second resistor of the resistive series connection. The method further includes feeding the signal to the amplified to an inner node of a resistance series connection between the first and second resistors to obtain, due to the first and second voltage drops, a first (voltage) shifted signal and a second (voltage) shifted signal, respectively, at the two outer terminals of the resistive series connection. The first (voltage) shifted signal is applied to a first transistor. The second (voltage) shifted signal is applied to a second transistor. The first and second transistors are connected in series and form a push-pull configuration. The current supplied to the resistive series connection adjusts a quiescent current of the push-pull configuration via the first and second voltage drops.

A method for amplifying a signal is disclosed. The method includes receiving a feedback signal from a push-pull amplifier and receiving a reference quiescent current signal. A control signal is generated on the basis of the feedback signal and the reference quiescent current signal. The method further includes applying the control signal and the signal to be amplified to a quiescent current adjuster for obtaining a first (voltage) shifted version of the signal to be amplified and a second (voltage) shifted version of the signal to be amplified. An amount by which the first and second (voltage) shifted versions are offset with respect to the signal to be amplified is determined by the control signal. The first and second (voltage) shifted versions are applied to a first transistor and to a second transistor, respectively. The first and second transistors are in push-pull configuration.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A push-pull amplifier comprising:
an input node;
a series connection of two resistors, the series connection comprising a first terminal, a second terminal, and a third terminal, wherein a first resistor of the two resistors is connected between the first terminal and the second terminal, wherein a second resistor of the two resistors is connected between the second terminal and the third terminal, and wherein the input node is connected to the second terminal;
a first controllable current source connected between the first terminal of the series connection and a first supply potential node for sourcing a first current to the series connection;
a second controllable current source connected between the third terminal of the series connection and a second supply potential node for sinking a second current from the series connection, wherein the first and second supply potential nodes are different;
a first transistor and a second transistor in push-pull configuration, wherein a control input of the first transistor is connected to the first terminal of the series connection and a control input of the second transistor is connected to the third terminal of the series connection,
wherein the first supply potential node is configured to couple to a first supply potential, and the second supply potential node is configured to couple to a second, different supply potential.

2. The push-pull amplifier according to claim 1, wherein the first controllable current source and the second controllable current source are controlled in a coordinated manner.

3. The push-pull amplifier according to claim 1, wherein the resistors have substantially equal resistances.

4. The push-pull amplifier according to claim 1, wherein the two resistors each have a resistance that is greater than a resistance of a conducting line.

5. The push-pull amplifier according to claim 1, further comprising:
a further input node, wherein the input node and the further input node form a differential input;
a further series connection of two further resistors, the series connection comprising a further first terminal, a further second terminal, and a further third terminal, wherein a first resistor of the two further resistors is connected between the further first terminal and the further second terminal, wherein a second resistor of the two further resistors is connected between the further second terminal and the further third terminal, and wherein the further input node is connected to the further second terminal;
a further first controllable current source connected to the further first terminal of the further series connection for sourcing a further first current to the further series connection;
a further second controllable current source connected to the further third terminal of the further series connection for sinking a further second current from the further series connection;
a further first transistor and a further second transistor in push-pull configuration, wherein a control input of the further first transistor is connected to the further first terminal of the further series connection and a control input of the further second transistor is connected to the further third terminal of the further series connection;
wherein an output signal generated by the first and second transistors and a further output signal generated by the further first and second transistors form a differential output signal.

6. The push-pull amplifier according to claim 1, further comprising:
a third current source connected to the third terminal of the series connection for sourcing a third current to the third terminal; and
a fourth current source connected to the first terminal of the series connection for sinking a fourth current from the first terminal;
wherein the third current and the fourth current cause an opposite current in the series connection that is opposite to the first current and the second current.

7. The push-pull amplifier according to claim 6, wherein the third and fourth current sources are constant current sources.

8. The push-pull amplifier according to claim 6, further comprising
a first supply rail and a second supply rail;
wherein the third current source is connected between the first supply rail and the third terminal of the series connection; and
wherein the fourth current source is connected between the first terminal of the series connection and the second supply rail.

9. The push-pull amplifier according to claim 1, further comprising:
a quiescent current control circuit for generating at least one control signal for first and second controllable current sources and for thereby controlling a quiescent current of the first and second transistors; and
a feedback line from the control input of the first transistor or the second transistor to the quiescent current control circuit.

10. The push-pull amplifier according to claim 9, wherein the quiescent current control circuit comprises:

a matched transistor that is matched to one of the first transistor and the second transistor and connected in a diode configuration;
a reference current source for generating a reference quiescent current and for feeding the reference quiescent current to the matched transistor;
a difference signal circuit, a first input of which is connected to a node between the matched transistor and the reference current source and a second input of which is connected to the feedback line, for generating a difference signal between said node and the feedback, and for providing the difference signal to the first and second controllable current sources as the at least one control signal.

11. The push-pull amplifier according to claim 9, wherein the quiescent current control circuit comprises an additional control loop for tracking a drain-source voltage or a base-emitter voltage of the matched transistor to be substantially equal to a drain-source voltage or a base-emitter voltage of the first transistor or the second transistor.

12. The push-pull amplifier according to claim 1, wherein the first transistor and the second transistor are complementary transistors.

13. The push-pull amplifier according to claim 1, wherein the push-pull amplifier is a class AB amplifier.

14. An amplification system comprising:
a push-pull amplifier;
a feedback line for feeding back a feedback signal from the push-pull amplifier;
a quiescent current control circuit for receiving the feedback signal and a reference quiescent current signal, and for generating a control signal on the basis of the feedback signal and the reference quiescent current signal; and
a quiescent current adjuster comprising a resistive series connection and a controllable current source arrangement for causing a current through the resistive series connection in response to the control signal, wherein an inner node of the resistive series connection is provided for receiving a signal to be amplified by the push-pull amplifier and wherein two outer terminals of the resistive series connection are connected to control terminals of a first portion and a complementary second portion, respectively, of the push-pull amplifier.

15. The amplification system according to claim 14,
wherein a first electric potential at a first outer terminal of the two outer terminals of the resistive series connection follows the signal to be amplified with a first offset, the first offset being determined by the current through the resistive series connection and a resistance between the inner node and the first terminal; and
wherein a second electric potential at a second outer terminal of the two outer terminals of the resistive series connection follows the signal to be amplified with a second offset, the second offset being determined by the current through the resistive series connection and a resistance between the inner node and the second terminal.

16. The amplification arrangement according to claim 14 for amplifying a pair of differential input signals and further comprising:
a common mode control arrangement for adjusting a common mode of the differential input signals in a way that the common mode of the differential output signals is equal to a reference common mode voltage;
a second push-pull amplifier for generating, in cooperation with the push-pull amplifier, a pair of differential output signals;
a second feedback line for feeding back, in cooperation with the feedback line, the pair of differential output signals to the common mode controller.

17. The amplification arrangement according to claim 16, wherein the common mode control arrangement operates independently from the quiescent current control circuit and the quiescent current adjuster.

18. The amplification arrangement according to claim 14, wherein the quiescent current control circuit comprises:
a matched transistor that is matched to at least one transistor of the push-pull amplifier, and that is connected in a diode configuration;
a reference current source for generating a reference quiescent current and for feeding the reference quiescent current to the matched transistor;
a difference signal circuit, a first input of which is connected to a node between the matched transistor and the reference current source and a second input of which is connected to the feedback line, for generating a difference signal between said node and the feedback line, and for providing the difference signal to the first and second controllable current sources as the at least one control signal.

19. The amplification arrangement according to claim 14, wherein the push-pull amplifier comprises a first field effect transistor and a second field effect transistor, and wherein the feedback signal is a gate signal applied to one of the first and second field effect transistors.

20. A mobile communication device comprising:
an antenna port;
a digital baseband processor; and
an RF-frontend coupled to the antenna port and to the digital baseband processor, and comprising a push-pull amplifier, the push-pull amplifier comprising:
an input node;
a series connection of two resistors, the series connection comprising a first terminal, a second terminal, and a third terminal, wherein a first resistor of the two resistors is connected between the first terminal and the second terminal, wherein a second resistor of the two resistors is connected between the second terminal and the third terminal, and wherein the input node is connected to the second terminal;
a first controllable current source connected between the first terminal of the series connection and a first supply potential node for sourcing a first current to the series connection;
a second controllable current source connected between the second terminal of the series connection and a second supply potential node for sinking a second current from the series connection, wherein the first and second supply potential nodes are different;
a first transistor and a second transistor in push-pull configuration, wherein a control input of the first transistor is connected to the first terminal of the series connection and a control input of the second transistor is connected to the third terminal of the series connection,
wherein the first supply potential node is configured to couple to a first supply potential, and the second supply potential node is configured to couple to a second, different supply potential.

21. A mobile communication device comprising:
an antenna port;
a digital baseband processor; and
an RF-frontend coupled between the antenna port and the digital baseband processor, and comprising an amplification system that comprises:
a push-pull amplifier;
a feedback line for feeding back a feedback signal from the push-pull amplifier;
a quiescent current control circuit for receiving the feedback signal and a reference current signal, and for generating a control signal on the basis of the feedback signal and the reference current signal; and
a quiescent current adjuster comprising a resistive series connection and a controllable current source arrangement for causing a current through the resistive series connection in response to the control signal, wherein an inner node of the resistive series connection is provided for receiving a signal to be amplified by the push-pull amplifier and wherein two outer terminals of the resistive series connection are connected to control terminals of a first portion and a second complementary portion, respectively, of the push-pull amplifier.

22. A method for amplifying a signal, the method comprising:
supplying a current to a resistive series connection to generate a first voltage drop over a first resistor and a second voltage drop over a second resistor of the resistive series connection, wherein a node between the first resistor and the second resistor comprises an inner node of the resistive series connection;
feeding the signal to be amplified to the inner node of a resistive series connection between the first and second resistors to obtain, due to the first and second voltage drops, a first shifted signal and a second shifted signal, respectively, at two outer terminals of the resistive series connection;
applying the first shifted signal to a first transistor; and
applying the second shifted signal to a second transistor, wherein the first and second transistors are connected in series and form a push-pull configuration;
wherein the current supplied to the resistive series connection adjusts a quiescent current of the push-pull configuration via the first and second voltage drops.

23. The method according to claim 22, wherein supplying the current to the resistive series connection comprises:
determining a current source arrangement control signal on the basis of at least a reference quiescent current signal; and
applying the current source arrangement control signal to a current source arrangement to generate the current to be supplied to the resistive series connection.

24. The method according to claim 23, wherein supplying the current to the resistive series connection further comprises:
receiving a feedback signal from at least one of the first and second transistors;
determining the current source arrangement control signal on the basis of the reference quiescent current signal and the feedback signal.

25. The method according to claim 22, wherein the signal to be amplified is a part of a pair of differential signals, and wherein the method further comprises:
supplying a further current to a further resistive series connection to generate a further first voltage drop over a further first resistor and a further second voltage drop over a further second resistor of the further resistive series connection;
feeding the other signal of the pair of differential signals to a further inner node of a further resistive series connection between the further first and further second resistors to obtain, due to the further first and further second voltage drops, a further first shifted signal and a further second shifted signal, respectively, at two outer terminals of the further resistive series connection;
applying the further first shifted signal to a further first transistor; and
applying the further second shifted signal to a further second transistor, wherein the further first and further second transistors are connected in series and form a further push-pull configuration;
wherein the further current supplied to the further resistive series connection adjusts a quiescent current of the further push-pull configuration via the further first and further second voltage drops; and
wherein the push-pull configuration and the further push-pull configuration generate a pair of differential output signals.

26. The method according to claim 25, further comprising:
adjusting a common mode of the pair of signals to be amplified, wherein adjusting the common mode is independent from controlling the quiescent current.

27. A method for amplifying a signal, the method comprising:
receiving a feedback signal from a push-pull amplifier;
receiving a reference quiescent current signal;
generating a control signal on the basis of the feedback signal and the reference quiescent current signal;
applying the control signal and the signal to be amplified to a quiescent current adjuster for obtaining a first shifted version of the signal to be amplified and a second shifted version of the signal to be amplified, wherein an amount by which the first and second shifted versions are offset with respect to the signal to be amplified is determined by the control signal;
applying the first and second shifted versions to a first transistor and to a second transistor, respectively, in push-pull configuration.

28. The method according to claim 27, wherein the signal to be amplified belongs to a pair of differential signals and wherein the method generates a pair of amplified differential signals, the method further comprising:
feeding back the pair of amplified differential signals;
controlling a common mode of the pair of differential signals on the basis of the pair of amplified differential signals and a reference common mode signal, in order to reduce a deviation between a common mode of the pair of amplified differential signals and the reference common mode signal.

* * * * *